(12) United States Patent
Kim et al.

(10) Patent No.: US 11,324,106 B2
(45) Date of Patent: May 3, 2022

(54) COOLING APPARATUS FOR ELECTRONIC ELEMENT

(71) Applicant: KMW INC., Hwaseong-si (KR)

(72) Inventors: Duk Yong Kim, Yongin-si (KR); Jun Woo Yang, Hwaseong-si (KR); Jin Soo Yeo, Hwaseong-si (KR); Chang Woo Yoo, Hwaseong-si (KR); Min Sik Park, Hwaseong-si (KR); Hye Yeon Kim, Gangjin-gun (KR)

(73) Assignee: KMW INC., Hwaseong-si (KR)

( * ) Notice: Subject to any disclaimer, the term of this patent is extended or adjusted under 35 U.S.C. 154(b) by 49 days.

(21) Appl. No.: 16/894,735

(22) Filed: Jun. 5, 2020

(65) Prior Publication Data

US 2020/0305270 A1    Sep. 24, 2020

Related U.S. Application Data

(63) Continuation of application No. PCT/KR2018/015620, filed on Dec. 10, 2018.

(30) Foreign Application Priority Data

Dec. 8, 2017   (KR) .......................... 10-2017-0168699
Dec. 10, 2018  (KR) .......................... 10-2018-0158228

(51) Int. Cl.
*H05K 1/02*     (2006.01)
*H05K 1/18*     (2006.01)
(Continued)

(52) U.S. Cl.
CPC ......... *H05K 1/0203* (2013.01); *H01L 23/427* (2013.01); *H01L 23/467* (2013.01);
(Continued)

(58) Field of Classification Search
CPC ... H01L 23/427; H01L 23/467; H01L 23/473; H01L 23/367; H01L 23/3672;
(Continued)

(56) References Cited

U.S. PATENT DOCUMENTS 6,144,556 A     11/2000  Lanclos
2004/0085733 A1*  5/2004  Leon .................. H05K 7/20336
                                              361/700
(Continued)

FOREIGN PATENT DOCUMENTS

JP    08-288682 A    11/1996
JP     3153018 U     8/2009
JP   2015-227768 A   12/2015

OTHER PUBLICATIONS

International Search Report for PCT/KR2018/015620 dated Mar. 21, 2019 and its English translation.
(Continued)

*Primary Examiner* — Adam B Dravininkas
(74) *Attorney, Agent, or Firm* — Insight Law Group, PLLC; Seung Lee

(57) ABSTRACT

A cooling apparatus for an electronic element is provided. The cooling apparatus includes a printed circuit board, a housing main body, an additional cooling part, and a heat transfer part. The printed circuit board includes one surface and another surface. A plurality of electronic elements are provided on the one surface of the printed circuit board. The housing main body includes an inner surface and an outer surface. The another surface of the printed circuit board is attached to the inner surface of the housing main body, and the outer surface of the housing main body has a plurality of first cooling ribs provided to protrude therefrom. The additional cooling part is disposed to be spaced apart from the outer surface of the housing main body, and dissipates heat transferred from the housing main body. The heat transfer
(Continued)

part has one end connected to the outer surface of the housing main body and another end connected to the additional cooling part to transfer heat generated from the plurality of electronic elements to the additional cooling part.

20 Claims, 7 Drawing Sheets

(51) Int. Cl.
  *H01L 23/427* (2006.01)
  *H01L 23/467* (2006.01)
  *H05K 7/20* (2006.01)
(52) U.S. Cl.
  CPC ............ *H05K 1/18* (2013.01); *H05K 7/20336* (2013.01); *H05K 2201/064* (2013.01)
(58) Field of Classification Search
  CPC ............ H01L 33/648; H05K 7/20336; H05K 1/0203; H05K 7/2039; H05K 7/20409; H05K 2201/064; H05K 7/20; H05K 7/20418; H05K 7/20436; H05K 1/18; H05K 7/20936
  See application file for complete search history.

(56) References Cited

U.S. PATENT DOCUMENTS

| | | | |
|---|---|---|---|
| 2005/0077028 A1* | 4/2005 | Oikawa | F28F 3/02 |
| | | | 165/80.4 |
| 2009/0154102 A1 | 6/2009 | Zhou et al. | |
| 2010/0078154 A1* | 4/2010 | Li | H01L 23/427 |
| | | | 165/104.31 |
| 2011/0228470 A1* | 9/2011 | Chang | G06F 1/20 |
| | | | 361/679.47 |
| 2012/0287578 A1 | 11/2012 | Huang et al. | |
| 2013/0294030 A1 | 11/2013 | Wang et al. | |
| 2015/0250022 A1* | 9/2015 | Kim | H01Q 1/246 |
| | | | 455/561 |
| 2016/0295679 A1 | 10/2016 | Yeini et al. | |
| 2016/0299545 A1* | 10/2016 | May | G06F 1/188 |
| 2017/0150645 A1* | 5/2017 | Huang | G02B 6/4278 |
| 2018/0231230 A1* | 8/2018 | Kim | F21V 31/005 |
| 2019/0267701 A1* | 8/2019 | Kim | H04B 7/0452 |

OTHER PUBLICATIONS

Office Action dated Jul. 6, 2021 from the Japanese Patent Office for Japanese Application No. 2020-530668.

* cited by examiner

COOLING APPARATUS FOR ELECTRONIC ELEMENT

CROSS-REFERENCE TO RELATED APPLICATIONS

This application is a Continuation of International Application No. PCT/KR2018/015620, filed on Dec. 10, 2018, which claims the benefit of and priority to Korean Patent Application Nos. 10-2017-0168699, filed on Dec. 8, 2017, and 10-2018-0158228, filed on Dec. 10, 2018, the content of which are herein incorporated by reference in their entirety.

TECHNICAL FIELD

The present disclosure relates to a cooling apparatus for an electronic element, and more specifically, to a cooling apparatus for an electronic element, which may receive heat from the electronic elements which generate heat to induce and dissipate the heat to the outside without installing a separate blowing fan inside a heat-generating place.

BACKGROUND ART

Generally, an electronic element generates heat at operation, and if the heat is not cooled in a space in which the electronic element is integrated, operating performance of the electronic element may be degraded.

The electronic element is mostly coupled by a soldering to a printed circuit board provided inside a case, and is disposed inside a completely enclosed space for protection from the outside. Particularly, an electronic element such as a recently applied FPGA element applied to an externally installed antenna device is preferably provided with a blowing fan inside the case to often discharge the heat from the enclosed space because it generates heat severely at operation, but is commonly protected by the completely enclosed case for preventing external foreign substances, rainwater, or the like from being introduced therein.

Accordingly, if the number of electronic elements provided in the enclosed space of the case as described above is small and there is not much heat generation, it is possible to sufficiently cool the heat generated from the electronic element only with an existing cooling area.

However, if the number of electronic elements increases, there is a limit in improving cooling performance only with the existing cooling structure inside the enclosed space itself, and there is a problem of causing failure of a product due to the introduction of the foreign substances in many cases because the structure is required to be changed so as to communicate the interior and the exterior of the case.

DISCLOSURE

Technical Problem

The present disclosure is intended to solve the above problem, and an object of the present disclosure is to provide a cooling apparatus for an electronic element with improved cooling performance, which may effectively cool the electronic element even while maintaining an enclosed space inside a case in which the electronic element is provided, without providing a separate blowing fan.

Further, another object of the present disclosure is to provide a cooling apparatus for an electronic element, which may induce and transfer heat from a limited heat-generating space to the outside, and directly collect the heat from the electronic element which causes heat generation concentration to configure an independent cooling route for each heat source.

Technical Solution

A preferred exemplary embodiment of a cooling apparatus for an electronic element according to the present disclosure includes: a printed circuit board which has a plurality of electronic elements provided on one surface thereof as a unit heat-generating element; a housing main body which has the other surface of the printed circuit board accommodated to be in close contact therewith, and has a plurality of first cooling ribs provided to protrude from the outer surface thereof; an additional cooling part which is disposed to be spaced apart from the outer surface of the housing main body, and dissipates heat transferred from the housing main body; and a heat transfer part which has one end connected to the outer surface of the housing main body and the other end connected to the additional cooling part to transfer heat generated from the electronic element to the additional cooling part.

Here, the additional cooling part may include: a plurality of second cooling ribs which are formed to protrude toward the housing main body; and a plurality of third cooling ribs which are formed to protrude in a direction opposite to the second cooling ribs.

Further, the heat transfer part may be composed of a heat pipe filled therein with heat transfer fluid.

Further, one end of the heat pipe may be connected between the plurality of first cooling ribs which are formed on the housing main body, and the other end of the heat pipe may be connected to one surface of the additional cooling part to accommodate a portion of the outer circumferential surface.

Further, the one end of the heat pipe may be connected to be inserted into a heat collecting block which is provided between the plurality of first cooling ribs formed on the housing main body.

Further, the other end of the heat pipe may be inserted into a heat contact groove part formed between the plurality of second cooling ribs which have a portion of the outer circumferential surface of the other end of the heat pipe formed on the additional cooling part.

Further, the one end and the other end of the heat pipe may be disposed in parallel with the outer surface of the housing main body and one surface of the additional cooling part formed with the plurality of second cooling ribs, respectively, and an intermediate portion between the one end and the other end of the heat pipe may be formed to be bent with respect to the one end and the other end of the heat pipe.

Further, the intermediate portion of the heat pipe may be formed to be inclined upward.

Further, the plurality of first cooling ribs, the plurality of second cooling ribs, and the plurality of third cooling ribs may be lengthily formed vertically so that air flows from the bottom to the top.

Further, the one end of the heat pipe may be connected to the outside of the housing main body as the bottom end and the other end of the heat pipe may be connected to the additional cooling part as the top end, and the heat pipe may be lengthily disposed vertically.

Another exemplary embodiment of a cooling apparatus for an electronic element according to the present disclosure includes: a housing main body which is provided with a cooling space in which a plurality of electronic elements are provided; an additional cooling part which is disposed to be spaced in parallel with the outer surface of the housing main body, and dissipates heat transferred from the housing main body; and a heat transfer part which has one end connected to the outer surfaces of the plurality of electronic elements and the other end connected to the additional cooling part to form an independent cooling route for each of the plurality of electronic elements to transfer heat generated from each of the plurality of electronic elements to the additional cooling part.

Advantageous Effects

According to a preferred exemplary embodiment of the cooling apparatus for the electronic element according to the present disclosure, it is possible to largely improve the cooling performance through the additional cooling part which is provided to enable the additional heat dissipation in addition to the plurality of first cooling ribs provided on the outer surface of the conventional housing main body.

DETAILED DESCRIPTION OF MAIN ELEMENTS

Figure 1:
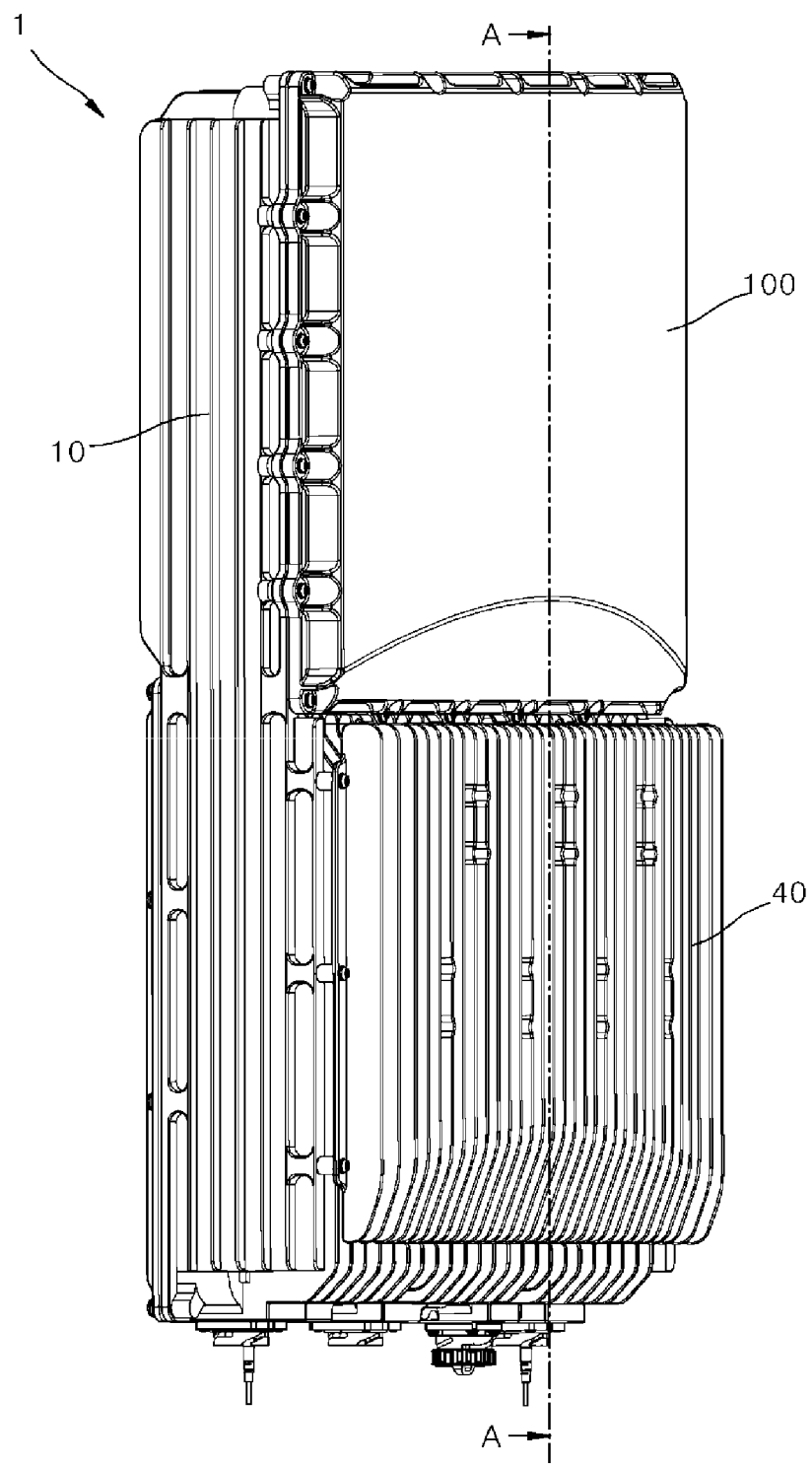
FIG. 1 is a perspective diagram illustrating an exemplary embodiment of a cooling apparatus for an electronic element according to the present disclosure.

1: cooling apparatus for an electronic element 10: housing main body
11: first cooling rib 15: first installation groove part
19: one side heat accommodating groove 20: printed circuit board
30: heat transfer part 30': heat pipe group
31: one end 33: the other end
35: intermediate portion 49: the other side heat accommodating groove
40: additional cooling part 41: second cooling rib
43: third cooling rib 45: second installation groove part
70: housing cover 71: cooling fin part
90: one side heat collecting block 95: the other side heat collecting block
100: ray dome

BEST MODE

Hereinafter, some exemplary embodiments of the present disclosure will be described in detail through exemplary drawings. It should be noted that in adding reference numerals to the components of each drawing, the same components have the same reference numerals as possible even though they are displayed on different drawings. Further, in describing the present disclosure, when it is determined that detailed descriptions of related well-known structures or functions may obscure the gist of the present disclosure, the detailed descriptions thereof will be omitted.

Throughout the specification, when a part "includes" or "has" a component, it means that the part may further include other components, rather than excluding other components, unless otherwise specified. The term of a configuration of "heat-generating element" used in the specification is a kind of an electronic element, and it is natural that the heat-generating element may be replaced with any component as long as it generates predetermined heat at operation.

Figure 2:
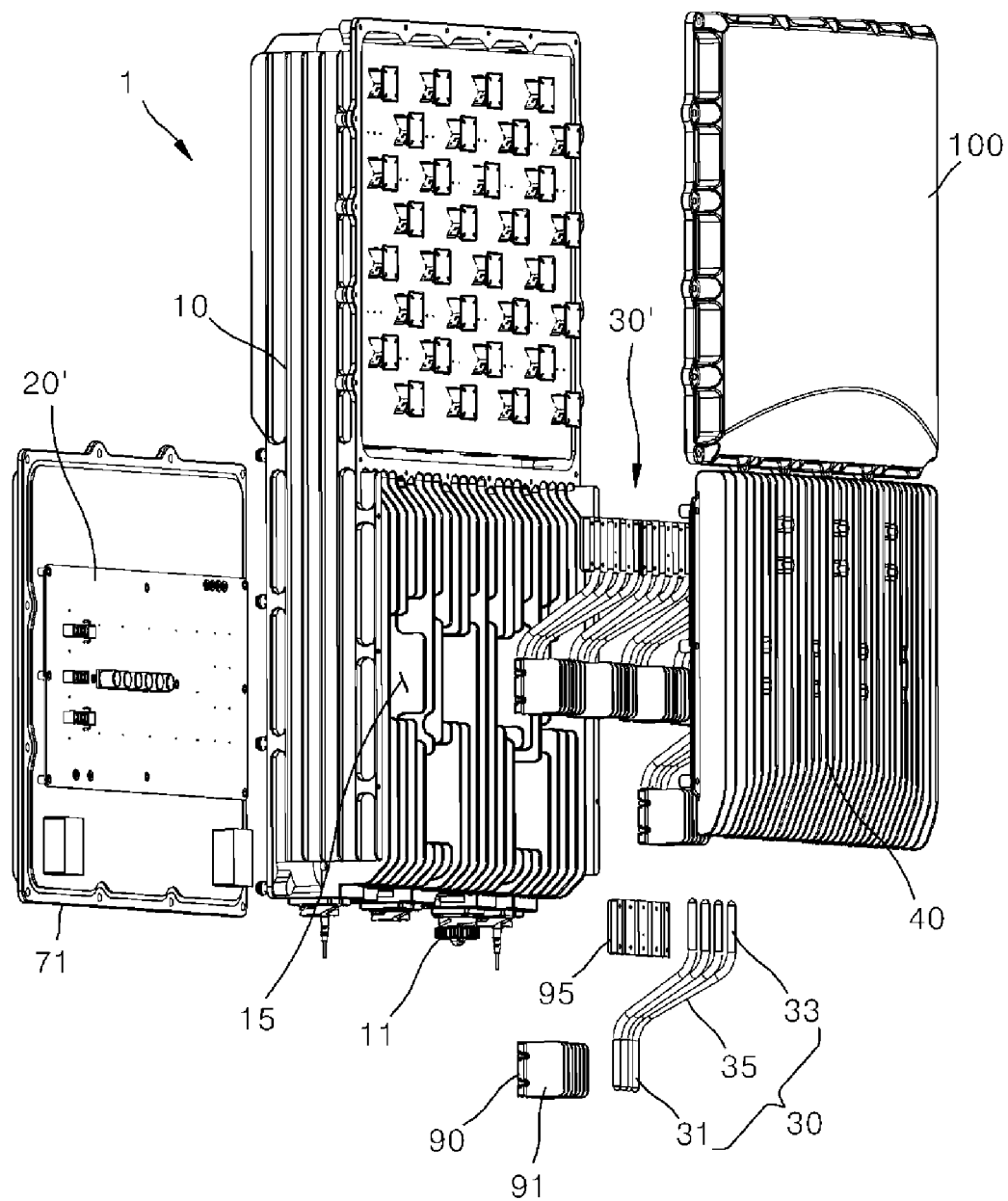
FIG. 2 is an exploded perspective diagram of FIG. 1.
Figure 3:
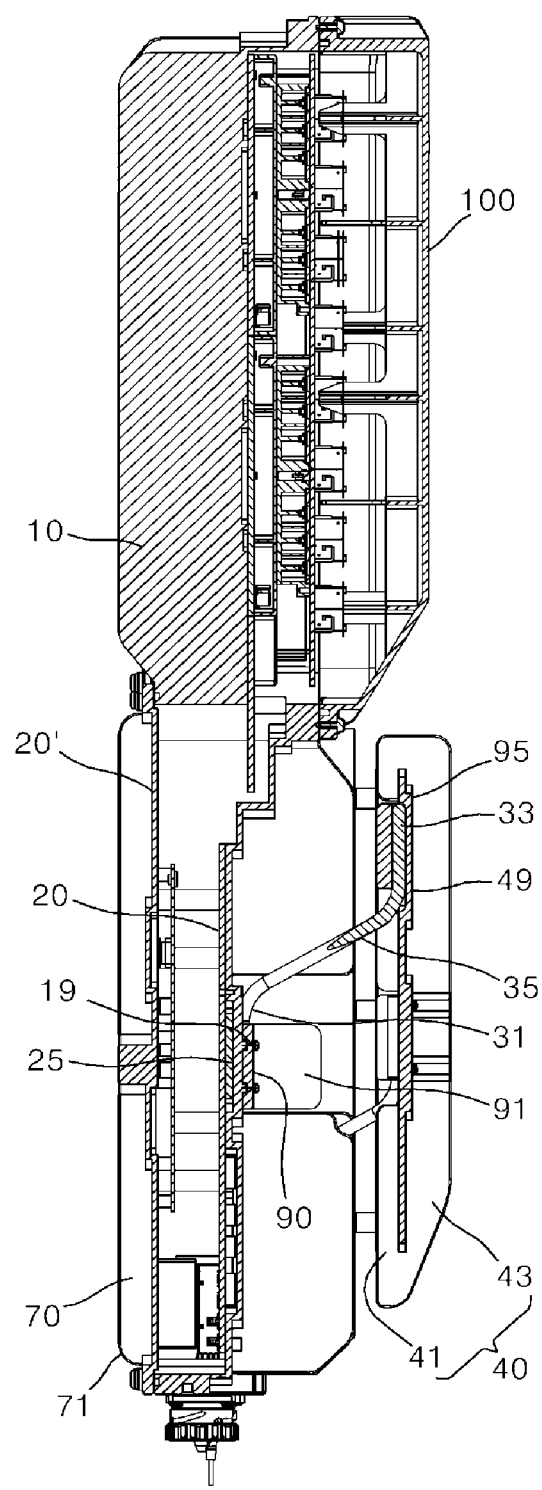
FIG. 3 is a cross-sectional diagram taken along the line A-A illustrated in FIG. 1.
Figure 4A:
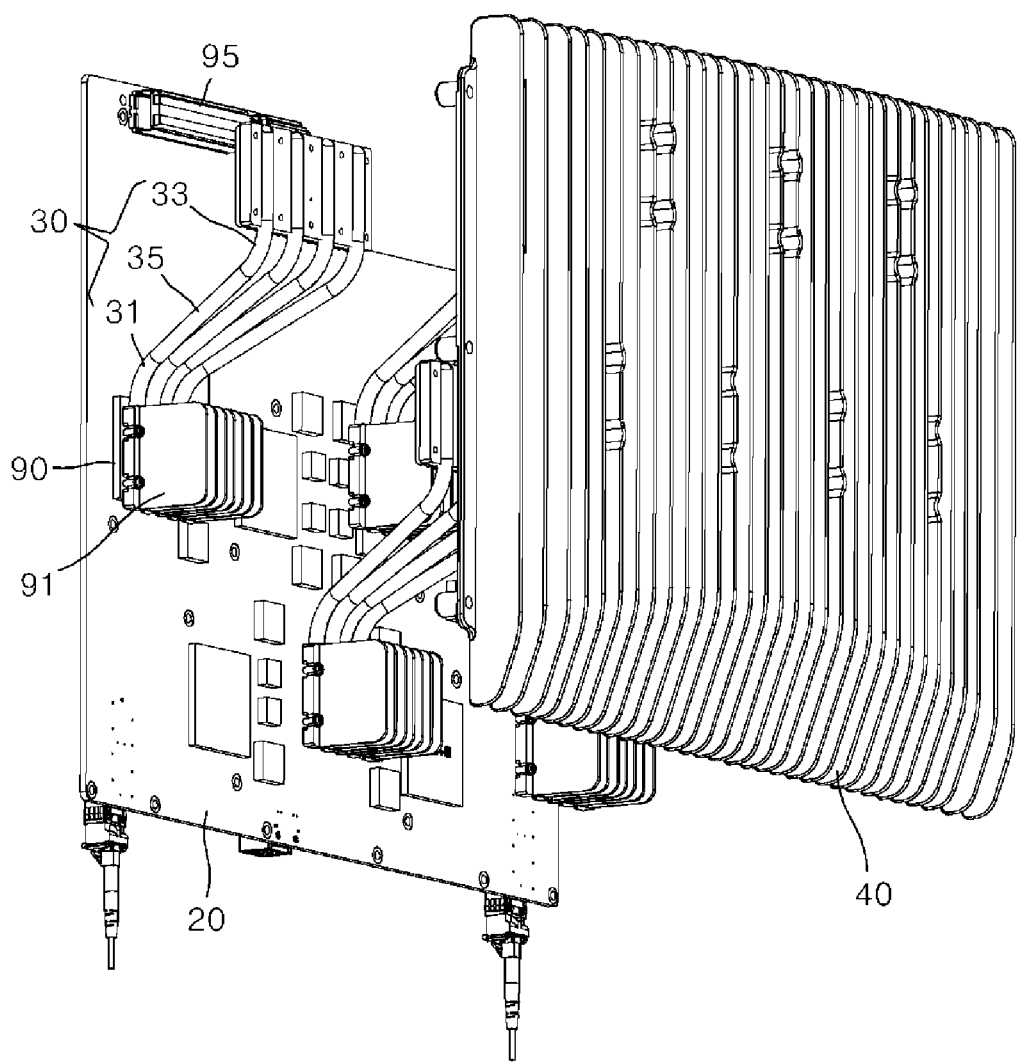
FIGS. 4A and 4B are one side and the other side exploded perspective diagrams illustrating a heat transfer part among the components illustrated in FIG. 1.
Figure 4B:
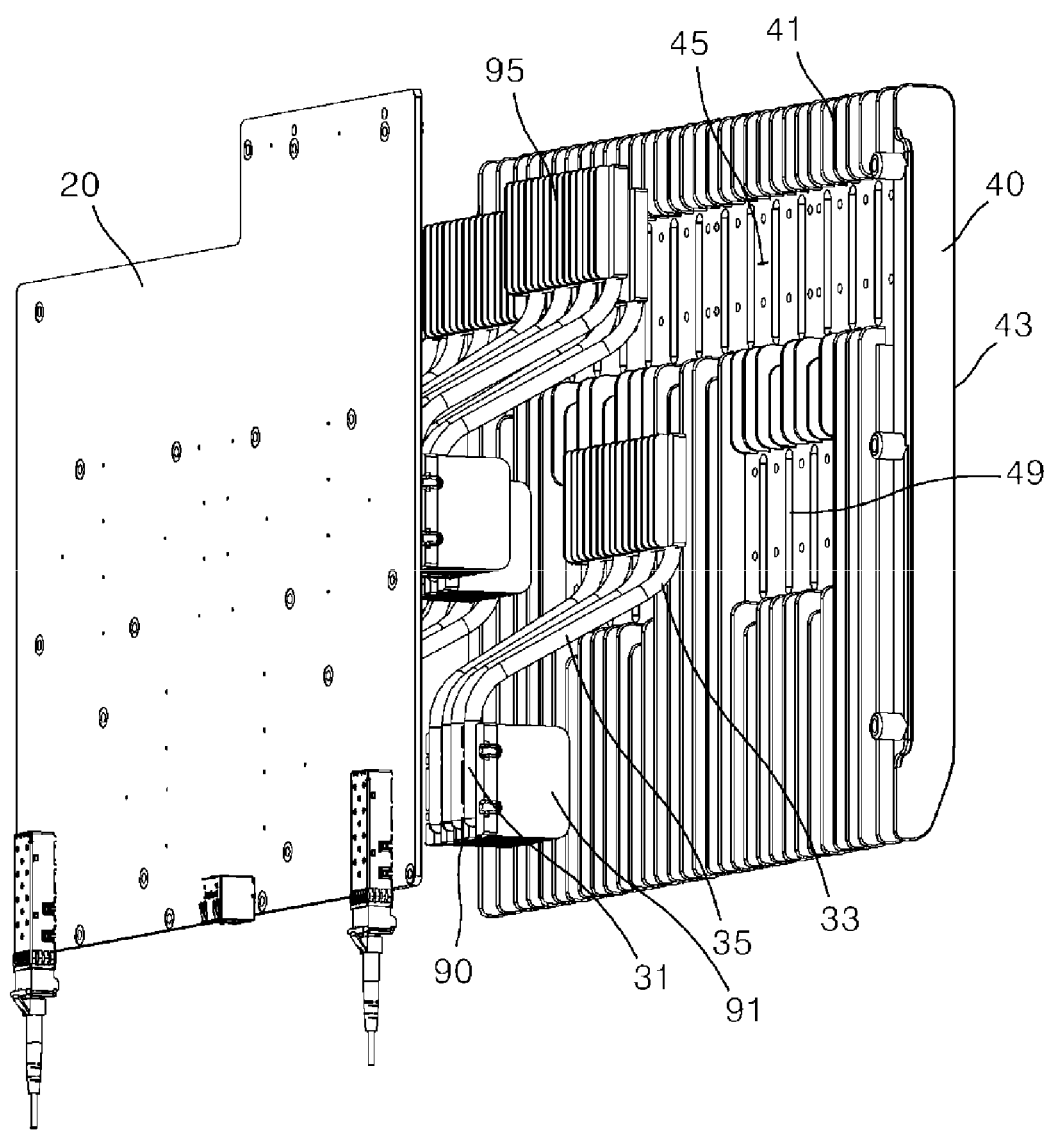
Figure 5:
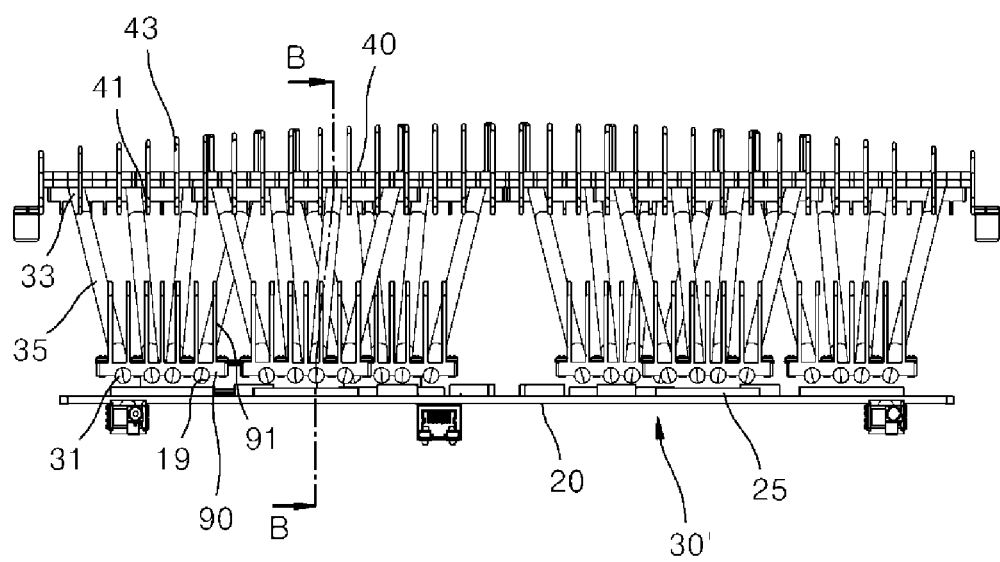
FIG. 5 is a plan diagram of FIGS. 4A and 4B.
Figure 6:
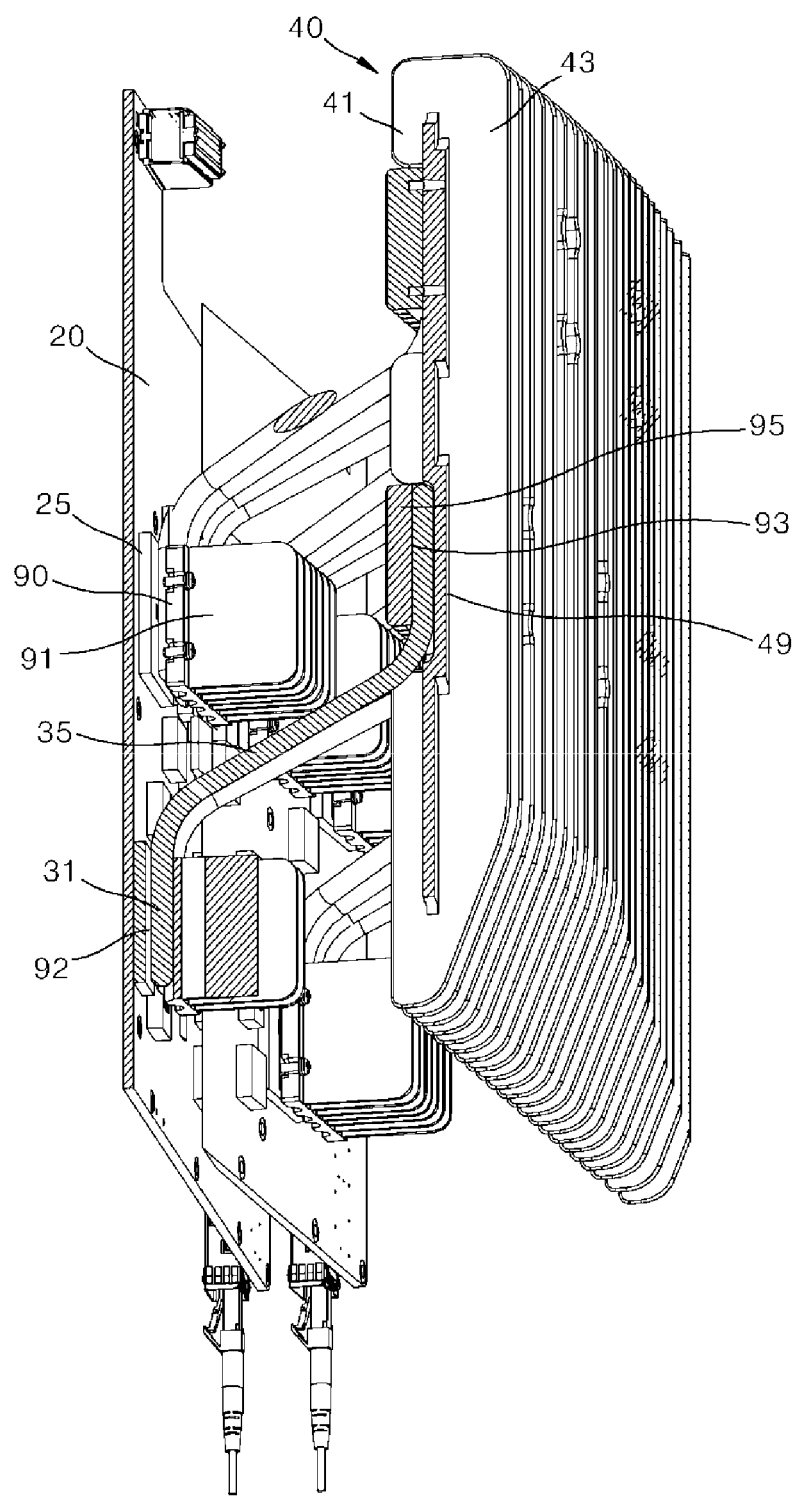
FIG. 6 is a cutout perspective diagram taken along the line B-B illustrated in FIG. 5.

FIG. 1 is a perspective diagram illustrating an exemplary embodiment of a cooling apparatus for an electronic element according to the present disclosure, FIG. 2 is an exploded perspective diagram of FIG. 1, FIG. 3 is a cross-sectional diagram taken along the line A-A illustrated in FIG. 1, FIGS. 4A and 4B are one side and the other side exploded perspective diagrams illustrating a heat transfer part among the components illustrated in FIG. 1, FIG. 5 is a plan diagram of FIGS. 4A and 4B, and FIG. 6 is a cutout perspective diagram taken along the line B-B illustrated in FIG. 5.

As illustrated in FIGS. 1 to 6, an exemplary embodiment of a cooling apparatus 1 for an electronic element according to the present disclosure includes a printed circuit board 20 which has a plurality of electronic elements 25 provided on one surface as heat-generating elements, a housing main body 10 which has the other surface of the printed circuit board 20 accommodated to be in close contact therewith, and has a plurality of first cooling ribs 11 provided to protrude from the outer surface thereof, an additional cooling part 40 which is disposed to be spaced in parallel with the outer surface of the housing main body 10, and dissipates heat transferred from the housing main body 10, and a heat transfer part 30 which has one end 31 connected to the outer surface of the housing main body 10 and the other end 33 connected to the additional cooling part 40 to transfer heat applied to the outer surface of the housing main body 10 to the additional cooling part 40.

Here, the plurality of electronic elements 25 are a concept of including all the heat-generating elements which generate a predetermined heat while operating electrically, and may be representatively a power supply unit (PSU), a field programmable gate array (FPGA) element, and the like which are installed in an antenna apparatus, and additionally, may also include an element configuration whose performance may be degraded by heat generation.

The housing main body 10 preferably has a vertical cross section which shapes substantially a '⊏'-shaped accommodating space so that one surface or the other surface of the printed circuit board 20 is accommodated in surface contact with one surface or the other surface of the housing main body 10.

More specifically, as illustrated in FIGS. 2 and 3, the top portion of the housing main body 10 forms the aforementioned accommodating space and is formed to be opened to the front side, such that communication elements or electronic elements (not illustrated) such as antenna elements (with no reference numerals) or a PSU may be accommodated inside the accommodating space and disposed in a laminated form, and the bottom portion of the housing main body 10 forms the aforementioned accommodating space and is formed to be opened to the rear side, such that the electronic element 25 composed of the heat-generating element such as FPGA elements may be disposed to be accommodated inside the accommodating space.

In the top portion of the housing main body 10 provided with the communication elements or the electronic elements such as the antenna elements or the PSU, a ray dome 100 is coupled to the opened front side of the housing main body 10, and thus is configured to prevent foreign substances from being introduced from the outside while a signal is transmitted or the signal is received without interference.

Further, as illustrated in FIGS. 1 to 3, in the bottom portion of the housing main body 10 provided with the electronic elements 25 such as FPGA elements, a housing cover 70 may be provided on the opened one side surface of the accommodating space so that the printed circuit board is installed and thus the housing cover 70 may be installed to shield the opened one surface of the housing main body 10.

In the housing main body 10, if it is necessary to additionally install the electronic element in addition to the aforementioned printed circuit board 20, as illustrated in FIG. 3, an additional printed circuit board 20' may be laminated and installed inside the housing main body 10 to be spaced apart from the previously installed printed circuit board 20 at a predetermined interval, and at this time, the outer surface of the housing cover 70 may be formed with a cooling fin part 71 which directly dissipates heat generated from the additional printed circuit board 20' to the outside.

However, in an exemplary embodiment of the present disclosure, since the ray dome 100 is coupled to the front surface of the top portion of the housing main body 10 as described above, it is difficult to add a component such as an additional cooling part 40 to be described later for dissipating the heat generated from the electronic elements such as the antenna elements or the PSU, and it is preferable designed so that the heat is dissipated through a one-way cooling structure by a plurality of cooling ribs 11 which are formed on the top rear surface of the housing main body 10.

That is, as described above, the outer surface opposite to the inner surface of the housing main body 10 in which the printed circuit board 20 is accommodated may be provided with a plurality of first cooling ribs 11 which primarily dissipate the heat generated by an operation of the electronic element mounted on the printed circuit board 20.

More specifically, when the heat generated from the electronic elements disposed in the accommodating space of the bottom portion of the housing main body 10 is dissipated through the cooling fin part 71 formed on the housing cover 70 and then forms the upward airflow, the plurality of first cooling ribs 11 may have each unit rib lengthily formed vertically so as not to interfere with the upward airflow, and may be formed to be spaced apart from each other at a predetermined distance in the left and right direction.

The plurality of first cooling ribs 11 formed on the outer surface of the housing main body 10 and the plurality of cooling fins 71 formed on the housing cover 70 described above perform a function of directly dissipating the heat generated from an inner space formed by the housing main body 10 and the housing cover 70 (hereinafter, referred to as 'a heat-generating space').

Meanwhile, the plurality of first cooling ribs 11 may be formed to have the same separation distance, respectively, and may have a first installation groove part, in which some of the plurality of first cooling ribs 11 are not formed so that the aforementioned heat transfer part 30 is installed, formed at a plurality of places.

As illustrated in FIG. 2, the additional cooling part 40 may include a plurality of second cooling ribs 41, which are formed on one surface and formed to protrude toward the housing main body 10, and a plurality of third cooling ribs 43, which are formed on the other surface and formed to protrude in a direction opposite to the second cooling ribs 41.

The additional cooling part 40 may be disposed outside the housing main body 10 so as to be spaced apart from the tips of the plurality of first cooling ribs 11 formed on the housing main body 10 via the heat transfer part 30 at a predetermined interval.

The plurality of second cooling ribs 41 and the plurality of third cooling ribs 43 may also be formed to have the same left and right separation distances, respectively, like the plurality of first cooling ribs 11 of the housing main body 10 described above, and may be lengthily disposed vertically.

The inner surface of the additional cooling part 40 on which the plurality of second cooling ribs 41 are provided may have a second installation groove part 45, in which some of the plurality of second cooling ribs 41 are not formed so that the aforementioned heat transfer part 30 is installed, formed in a plurality of places.

Meanwhile, the heat transfer part 30 serves to directly collect heat from the plurality of electronic elements 25 provided in the heat-generating space formed by the housing main body 10 and the housing cover 70 described above to induce and transfer the collected heat to the outside, thereby configuring an independent cooling route for each heat source (that is, for each electronic element). For example, if the electronic element 25 provided in the heat-generating space is provided in a predetermined number, the number of heat transfer parts 30 is provided to correspond to the number of electronic element 25, and the heat generated from the respective electronic elements 25 is dissipated to the outside through the independent cooling route formed by each heat transfer part 30.

The heat transfer part 30 may be composed of a plurality of heat pipes filled with heat transfer fluid therein. The heat transfer fluid filled inside the heat pipe may perform a function of moving the heat from one end of the heat pipe to the other end thereof by repeatedly performing an operation in which when heat is supplied from one side, the heat transfer fluid is vaporized to rise upward to transfer the heat to the top of the heat pipe and then liquefied to return to an original location thereof by gravity.

Here, one end 31 of the heat pipe 30 may be connected to the first installation groove part 15 which is provided between the plurality of first cooling ribs 11 formed on the housing main body 10, and the other end 33 of the heat pipe 30 may be connected to the second installation groove part 45 which is formed in the inner surface of the additional cooling part 40.

More specifically, as illustrated in FIGS. 2 to 4, the heat transfer part 30 may have the one end 31 of the unit heat pipe 30 provided in parallel with the outer surface of the electronic element 25 provided in the heat-generating space of the housing main body 10 to be coupled to one side surface of the printed circuit board 20 via a one side heat collecting block 90 to be described later, and may have the other end 33 of the unit heat pipe 30 coupled in parallel to be in surface contact with the inner surface of the additional cooling part 40 via the other side heat collecting block 95 to be described later.

Meanwhile, the first installation groove part 15 may be installed with the one side heat collecting block 90 which mediates the intensive installation of one end of a heat pipe group 30' having a plurality of unit heat pipes 30, and the second installation groove part 45 may be installed with the other side heat collecting block 95 which mediates the distributed installation of the other end of the heat pipe group 30' having the plurality of unit heat pipes 30.

Here, as illustrated in FIGS. 4A and 4B, the one end 31 of the heat pipe group 30' may be connected to be inserted into a one side heat transfer groove 92 to be described later of the one side heat collecting block 90 which is in surface contact therewith through the first installation groove part 15 provided so that the plurality of electronic elements 25 are exposed to the outside in the heat-generating space of the housing main body 10. The one side heat collecting block 90 may be installed so that one ends of the plurality of heat pipes 30 become dense in order to intensively collect the heat generated from one electronic element 25.

Here, as illustrated in FIGS. 4A and 4B, the outside of the one side heat collecting block 90 may be formed with a plurality of block cooling ribs 91 which immediately dissipate some of the heat collected through the heat pipe group 30'. Here, a space to which the heat is dissipated by the block cooling rib 91 is a space which is formed between the housing main body 10 and the additional cooling part 40, and is the same as the space to which the heat is dissipated by the plurality of first cooling ribs 11.

Conversely, as illustrated in FIGS. 4A and 4B, the other end 33 of the heat pipe group 30' may be seated in a other side heat accommodating groove 49 to be described later formed in the inner surface of the additional cooling part 40 in which the second installation groove part 45 is provided and may be coupled to be inserted into a hole which is formed by a other side heat transfer groove 93 formed in the other side heat collecting block 95. The other side heat collecting block 95 is installed so that the plurality of heat pipes 30 are distributed on the inner surface of the additional cooling part 40 to serve to prevent the heat transferred by the heat pipe group 30' from being biased and transferred to one side.

That is, the one side heat collecting block 90 serves to transfer the heat discharged to the outer surface of each of the electronic elements 25 provided in the heat-generating space of the housing main body 10 to the one end of the heat pipe group 30' which is intensively installed to collect the heat, and the other side heat collecting block 95 serves to evenly transfer the heat transferred through the heat pipe group 30' to the inner surface of the additional cooling part 40. The one side heat collecting block 90 and the other side heat collecting block 95 are preferably disposed to correspond to the number of heat pipe groups 30'.

Further, the one side heat collecting block 90 and the other side heat collecting block 95 may be formed with the one side heat transfer groove and the other side heat transfer groove 92, 93 into which the one end 31 and the other end 33 of each of the heat pipe group 30' are inserted and seated.

The one end 31 and the other end 33 of the unit heat pipe 30 of the plurality of heat pipe groups 30' may be provided to be seated in a one side heat accommodating groove 19, which is formed so that the outer surface of the housing main body 10 is recessed, and the other side heat accommodating groove 49, which is formed so that the inner surface of the additional cooling part 40 is recessed, respectively.

Here, the one end 31 and the other end 33 of the heat pipe 30 are disposed in parallel with the outer surface of the housing main body 10 and one surface of the additional cooling part 40 in which the plurality of second cooling ribs 41 are formed, respectively, and an intermediate portion 35 between the one end 31 and the other end 33 of the heat pipe 30 may be formed to be bent with respect to the one end 31 and the other end 33 of the heat pipe 30.

More specifically, the intermediate portion 35 of the heat pipe 30 may be formed to be inclined upward with the aforementioned one end 31 as the bottom end and the aforementioned other end 33 as the top end. That is, when the plurality of first cooling ribs 11, the plurality of second cooling ribs 41, and the plurality of third cooling ribs 43 are lengthily formed vertically so that air flows from the bottom to the top, the one end 31 of the heat pipe 30 is connected to the outside of the housing main body 10 as the bottom end, the other end 33 of the heat pipe 30 is connected to the additional cooling part 40 as the top end, and the intermediate portion 35 of the heat pipe 30 is lengthily disposed vertically and formed to be inclined upward.

The cooling process by the cooling apparatus 1 for the electronic elements according to the present disclosure configured as described above will be briefly described as follows.

When the operating heat by the operation of the electronic element 25 provided on the inner surface of the housing main body 10 is generated and transferred to the outer surface of the housing main body 10, the one side heat collecting block 90 collects the heat.

At this time, since the one side heat collecting block 90 is exposed to the outside together with the first cooling rib 11, some of the heat transferred from the electronic element 25 is immediately dissipated through the block cooling rib 91.

Further, the residual heat which is not collected by the one side heat collecting block 90 may be primarily dissipated through the plurality of first cooling ribs 11 formed on the outer surface of the housing main body 10.

Meanwhile, the heat collected in the one side heat collecting block 90 is transferred to the heat pipe group 30' in a state where the one ends 31 of the plurality of unit heat pipes 30 are intensively disposed, and transferred toward the other end 33 of the heat pipe group 30' by an operation of evaporating the heat transfer fluid within each of the unit heat pipes 30.

The heat transferred toward the other end 33 of the unit heat pipe 30 may be secondarily dissipated through the plurality of second cooling ribs 41 and the plurality of third cooling ribs 43 which are provided on the additional cooling part 40 via the other side heat collecting block 95.

At this time, the heat transferred to the other end of the heat pipe group 30' by the other side heat collecting block 95 provided on the inner surface of the additional cooling part 40 may be evenly distributed to be balanced throughout the entire additional cooling part 40, thereby preventing a heat concentration phenomenon.

Accordingly, in an exemplary embodiment of the cooling apparatus 1 for the electronic elements according to the present disclosure, even if the number of electronic elements 25 integrated on the printed circuit board 20 increases, there is an advantage in that cooling performance may be expanded by the heat transfer part 30 and the additional cooling structure of the additional cooling part 40 described above.

As described above, the exemplary embodiments of the cooling apparatus for the electronic elements according to the present disclosure have been described in detail with reference to the accompanying drawings. However, it will be natural that the exemplary embodiment of the present disclosure is not necessarily limited to the aforementioned exemplary embodiments, and various modifications and practice in an equivalent scope are possible by those skilled in the art to which the present disclosure pertains. Accordingly, the true scope of the present disclosure will be defined by the claims to be described later.

INDUSTRIAL APPLICABILITY

Exemplary embodiments of the cooling apparatus for the electronic elements according to the present disclosure may be particularly used in the antenna apparatus having the electronic element with high heat generation.

The invention claimed is:

1. A cooling apparatus for an electronic element comprising:
    a printed circuit board comprising one surface and another surface, wherein plurality of electronic elements are provided on the one surface of the printed circuit board;
    a housing main body comprising an inner surface and an outer surface, wherein the another surface of the printed circuit board is attached to the inner surface, and the outer surface of the housing main body has a plurality of first cooling ribs provided to protrude therefrom;
    an additional cooling part which is disposed to be spaced apart from the outer surface of the housing main body, and dissipates heat transferred from the housing main body; and
    a heat transfer part which has one end connected to the outer surface of the housing main body and another end connected to the additional cooling part to transfer heat generated from the plurality of electronic elements to the additional cooling part.

2. The cooling apparatus for the electronic element of claim 1,
    wherein the additional cooling part comprises: a plurality of second cooling ribs which are formed to protrude toward the housing main body, and a plurality of third cooling ribs which are formed to protrude in a direction opposite to the second cooling ribs.

3. The cooling apparatus for the electronic element of claim 2,
    wherein the heat transfer part comprises a heat pipe filled therein with heat transfer fluid.

4. The cooling apparatus for the electronic element of claim 3,
    wherein one end of the heat pipe is connected between the plurality of first cooling ribs which are formed on the housing main body, and
    wherein another end of the heat pipe is connected to one surface of the additional cooling part to accommodate a portion of an outer circumferential surface of the heat pipe.

5. The cooling apparatus for the electronic element of claim 4,
    wherein the one end and the another end of the heat pipe are disposed in parallel with the outer surface of the housing main body and one surface of the additional cooling part formed with the plurality of second cooling ribs, respectively, and
    wherein an intermediate portion between the one end and the another end of the heat pipe is formed to be bent with respect to the one end and the another end of the heat pipe.

6. The cooling apparatus for the electronic element of claim 3,
    wherein the one end of the heat pipe is connected to be inserted into a heat collecting block which is provided between the plurality of first cooling ribs formed on the housing main body.

7. The cooling apparatus for the electronic element of claim 6,
    wherein the one end and the another end of the heat pipe are disposed in parallel with the outer surface of the housing main body and one surface of the additional cooling part formed with the plurality of second cooling ribs, respectively, and
    wherein an intermediate portion between the one end and the another end of the heat pipe is formed to be bent with respect to the one end and the another end of the heat pipe.

8. The cooling apparatus for the electronic element of claim 3,
    wherein a portion of an outer surface circumferential surface of the another end of the heat pipe is inserted into a heat contact groove part formed on the additional cooling part between the plurality of second cooling.

9. The cooling apparatus for the electronic element of claim 8,
    wherein the one end and the another end of the heat pipe are disposed in parallel with the outer surface of the housing main body and one surface of the additional cooling part formed with the plurality of second cooling ribs, respectively, and
    wherein an intermediate portion between the one end and the another end of the heat pipe is formed to be bent with respect to the one end and the another end of the heat pipe.

10. The cooling apparatus for the electronic element of claim 3,
    wherein the one end and the another end of the heat pipe are disposed in parallel with the outer surface of the housing main body and the one surface of the additional cooling part formed with the plurality of second cooling ribs, respectively, and
    wherein an intermediate portion between the one end and the another end of the heat pipe is formed to be bent with respect to the one end and the another end of the heat pipe.

11. The cooling apparatus for the electronic element of claim 10,
    wherein the intermediate portion of the heat pipe is formed to be inclined upward.

12. The cooling apparatus for the electronic element of claim 10,
    wherein the plurality of first cooling ribs, the plurality of second cooling ribs, and the plurality of third cooling ribs are longitudinally formed in a vertical direction so that air flows from the bottom to the top.

13. The cooling apparatus for the electronic element of claim 12,
    wherein the one end of the heat pipe is connected to the outer surface of the housing main body and the another end of the heat pipe is connected to the additional cooling part, and the heat pipe is longitudinally disposed in a vertical direction.

14. A cooling apparatus for an electronic element comprising:
    a housing main body comprising a cooling space in which a plurality of electronic elements are provided, wherein the housing body comprises an inner surface and an outer surface, and the outer surface of the housing main body has a plurality of first cooling ribs provided to protrude therefrom;
    an additional cooling part which is disposed to be spaced in parallel with the outer surface of the housing main body, and dissipates heat transferred from the housing main body; and
    a heat transfer part which has one end connected to the outer surface of housing main body and the another end connected to the additional cooling part to transfer heat generated from each of the plurality of electronic elements to the additional cooling part.

15. The cooling apparatus for the electronic element of claim 14,
wherein the additional cooling part comprises: a plurality of second cooling ribs which are formed to protrude toward the housing main body in a first direction, and a plurality of third cooling ribs which are formed to protrude in a second direction different from the first direction.

16. The cooling apparatus for the electronic element of claim 15,
wherein the heat transfer part comprises a heat pipe filled therein with heat transfer fluid.

17. The cooling apparatus for the electronic element of claim 16,
wherein one end of the heat pipe is connected between the plurality of first cooling ribs which are formed on the housing main body, and
wherein another end of the heat pipe is connected to one surface of the additional cooling part to accommodate a portion of an outer circumferential surface of the heat pipe.

18. The cooling apparatus for the electronic element of claim 16,
wherein the one end of the heat pipe is connected to be inserted into a heat collecting block which is provided between the plurality of first cooling ribs formed on the housing main body.

19. The cooling apparatus for the electronic element of claim 16,
wherein a portion of an outer surface circumferential surface of the another end of the heat pipe is inserted into a heat contact groove part formed on the additional cooling part between the plurality of second cooling ribs.

20. The cooling apparatus for the electronic element of claim 16,
wherein the one end and the another end of the heat pipe are disposed in parallel with the outer surface of the housing main body and the one surface of the additional cooling part formed with the plurality of second cooling ribs, respectively, and
wherein an intermediate portion between the one end and the another end of the heat pipe is formed to be bent with respect to the one end and the another end of the heat pipe.

* * * * *